(12) United States Patent
Hsiao

(10) Patent No.: US 10,936,391 B2
(45) Date of Patent: Mar. 2, 2021

(54) MEMORY MANAGEMENT METHOD AND STORAGE CONTROLLER

(71) Applicant: SHENZHEN EPOSTAR ELECTRONICS LIMITED CO., Shenzhen (CN)

(72) Inventor: Yu-Hua Hsiao, Hsinchu County (TW)

(73) Assignee: SHENZHEN EPOSTAR ELECTRONICS LIMITED CO., Shenzhen (CN)

(*) Notice: Subject to any disclaimer, the term of this patent is extended or adjusted under 35 U.S.C. 154(b) by 15 days.

(21) Appl. No.: 15/912,545

(22) Filed: Mar. 5, 2018

(65) Prior Publication Data
US 2019/0129776 A1 May 2, 2019

(30) Foreign Application Priority Data
Nov. 1, 2017 (TW) .................................. 106137732

(51) Int. Cl.
| G06F 11/07 | (2006.01) |
| G11C 16/34 | (2006.01) |
| G11C 11/408 | (2006.01) |
| G06F 11/10 | (2006.01) |
| G11C 29/02 | (2006.01) |
| G11C 29/44 | (2006.01) |
| G11C 29/42 | (2006.01) |
| G11C 29/12 | (2006.01) |

(52) U.S. Cl.
CPC .......... *G06F 11/076* (2013.01); *G06F 11/10* (2013.01); *G11C 11/4087* (2013.01); *G11C 16/3422* (2013.01); *G11C 29/025* (2013.01); *G11C 29/42* (2013.01); *G11C 29/44* (2013.01); *G11C 2029/1202* (2013.01)

(58) Field of Classification Search
CPC ............... G06F 11/076; G06F 11/0727; G06F 11/1012; G06F 11/1048
See application file for complete search history.

(56) References Cited

U.S. PATENT DOCUMENTS

| 2012/0224421 A1* | 9/2012 | Litsyn ..................... G11C 16/08 365/185.03 |
| 2015/0220391 A1* | 8/2015 | Chilappagari ...... G06F 11/1048 714/764 |
| 2018/0374549 A1* | 12/2018 | Padilla ............... G11C 16/3427 |

\* cited by examiner

*Primary Examiner* — Jigar P Patel
(74) *Attorney, Agent, or Firm* — JCIPRNET

(57) ABSTRACT

A memory management method and a storage controller are provided. The method includes performing a decoding operation to a first data stored in a first word line among multiple word lines of a rewritable non-volatile memory module to determine whether the decoding operation is successful or failed, and obtain a first error value of the first word line; when the decoding operation is determined as successful, determining whether to mark the first word line as a bad word line according to the first error value and a first threshold; and when the decoding operation is determined as failed, obtaining a second error value of a second word line adjacent to the first word line, and determining whether to mark both of the first and second word lines as the bad word line according to the first error value, the second error value, and a first threshold.

20 Claims, 10 Drawing Sheets

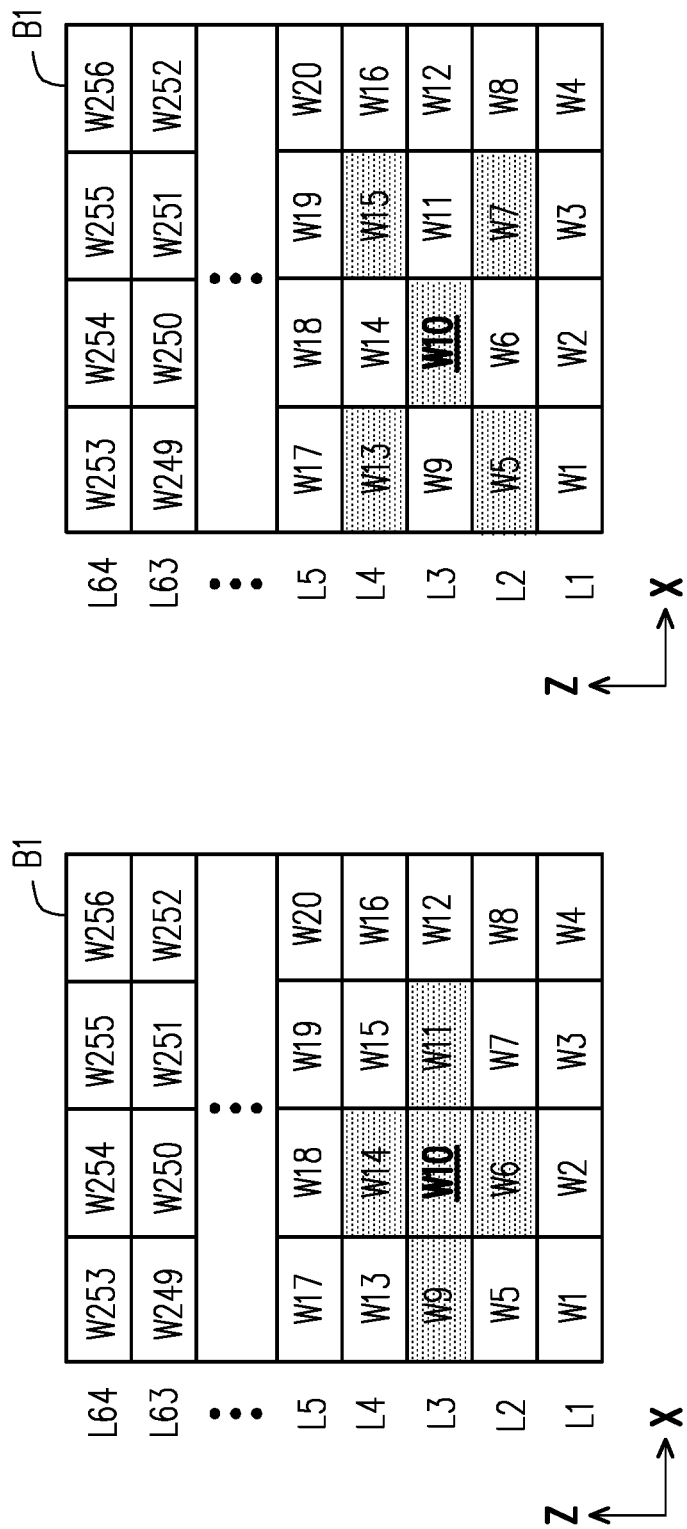

MEMORY MANAGEMENT METHOD AND STORAGE CONTROLLER

CROSS-REFERENCE TO RELATED APPLICATION

This application claims the priority benefit of Taiwan application serial no. 106137732, filed on Nov. 1, 2017. The entirety of the above-mentioned patent application is hereby incorporated by reference herein and made a part of this specification.

BACKGROUND OF THE INVENTION

Field of the Invention

The invention relates to a memory management method, and particularly relates to a memory management method and a storage controller adapted to a storage device configured with a rewritable non-volatile memory module.

Description of Related Art

Generally, a rewritable non-volatile memory module has a plurality of physical blocks, each of the physical blocks has a plurality of memory cells, and the memory cells may construct a plurality of word lines (each of the physical blocks has a plurality of the word lines). The memory cells in the rewritable non-volatile memory module may be damaged due to increase of use times, etc., which results in a fact that one or more physical blocks can no longer be used. Conventionally, a controller of the rewritable non-volatile memory module may detect or decide the no longer used physical blocks as bad physical blocks, and does not use the bad physical blocks for storing data. However, the word lines in each of the decided bad physical blocks are not all damaged. Therefore, a total available space of the rewritable non-volatile memory module is excessively decreased due to decision of the bad physical blocks.

For example, it is assumed that a physical block is decided/marked as a bad physical block according to the conventional method, and the physical block cannot store data and has some applicable word lines (undamaged word lines, and suitable for properly storing data). In this case, the applicable word lines of the physical block cannot be used because that the physical block has been decided/marked as the bad physical block, which results in a fact that the applicable word lines of the physical block cannot be used for storing data, and an available space corresponding to the applicable word lines in the bad physical block is wasted.

Therefore, how to effectively determine/recognize whether a plurality of word lines in each of the physical blocks is damaged, so as to meticulously determine a damage range of the memory cells of the rewritable non-volatile memory module to improve utilization efficiency of the available space of the rewritable non-volatile memory module is one of the subjects to be studied by related technicians of the field.

SUMMARY OF THE INVENTION

The invention is directed to a memory management method and a storage controller, by which by performing a decoding operation to a word line in a plurality of word lines of a plurality of physical blocks of a rewritable non-volatile memory module, it is determined whether to mark the word line as a bad word line, so as to efficiently recognize whether the word lines of rewritable non-volatile memory module are damaged.

An embodiment of the invention provides a memory management method adapted to a rewritable non-volatile memory module, where the rewritable non-volatile memory module has a plurality of word lines, and each of the word lines is composed of one or more memory cells. The memory management method includes performing a first type decoding operation to a first data stored in a first word line among the word lines to determine whether the first type decoding operation is successful or failed, and to obtain a first error value of the first word line; when the first type decoding operation is determined as successful, determining whether to mark the first word line as a bad word line according to the first error value and a first threshold; and when the first decoding operation is determined as failed, obtaining a second error value of a second word line adjacent to the first word line, and determining whether to mark both of the first word line and the second word line as the bad word line according to the first error value, the second error value, and a second threshold.

An embodiment of the invention provides a storage controller adapted to control a storage device configured with a rewritable non-volatile memory module, where the rewritable non-volatile memory module has a plurality of word lines, and each of the word lines is composed of one or more memory cells. The storage controller includes a connection interface circuit, a memory interface control circuit, a processor, an error checking and correcting circuit. The connection interface circuit is used for coupling to a host system. The memory interface control circuit is used for coupling to the rewritable non-volatile memory module. The error checking and correcting circuit is used for performing a decoding operation. The processor is used for instructing the error checking and correcting circuit to perform a first type decoding operation to a first data stored in a first word line among the word lines to determine whether the first type decoding operation is successful or failed, and to obtain a first error value of the first word line. When the first type decoding operation is determined as successful, the processor further determines whether to mark the first word line as a bad word line according to the first error value and a first threshold. When the first decoding operation is determined as failed, the processor obtains a second error value of a second word line adjacent to the first word line, and determines whether to mark both of the first word line and the second word line as the bad word line according to the first error value, the second error value, and a second threshold.

According to the above description, in the memory management method and the storage controller provided by the embodiment of the invention, the decoding operation is performed to the data stored in the first word line among the word lines of the rewritable non-volatile memory module, so as to determine whether to mark the first bit line as a bad word line according to the result of the decoding operation and the correspondingly obtained error value. Moreover, a decoding operation is further performed to the data stored in the second word line adjacent to the first word line, so as to determine whether to mark both of the first word line and the second word line as the bad word line according to the result of the decoding operation and the correspondingly obtained error value. In this way, it is effectively determined whether the word lines of the rewritable non-volatile memory module are damaged, so as to improve utilization efficiency of an available space of the rewritable non-volatile memory module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A, 3B, 3C, 3D are schematic diagrams of word line short of different patterns according to an embodiment of the invention.

DESCRIPTION OF EMBODIMENTS

In the present embodiment, a storage device includes a rewritable non-volatile memory module and a storage device controller (which is also referred to as a storage controller or a storage control circuit). Moreover, the storage device is used together with a host system, and the host system may write data into the storage device or read data from the storage device.

Figure 1:
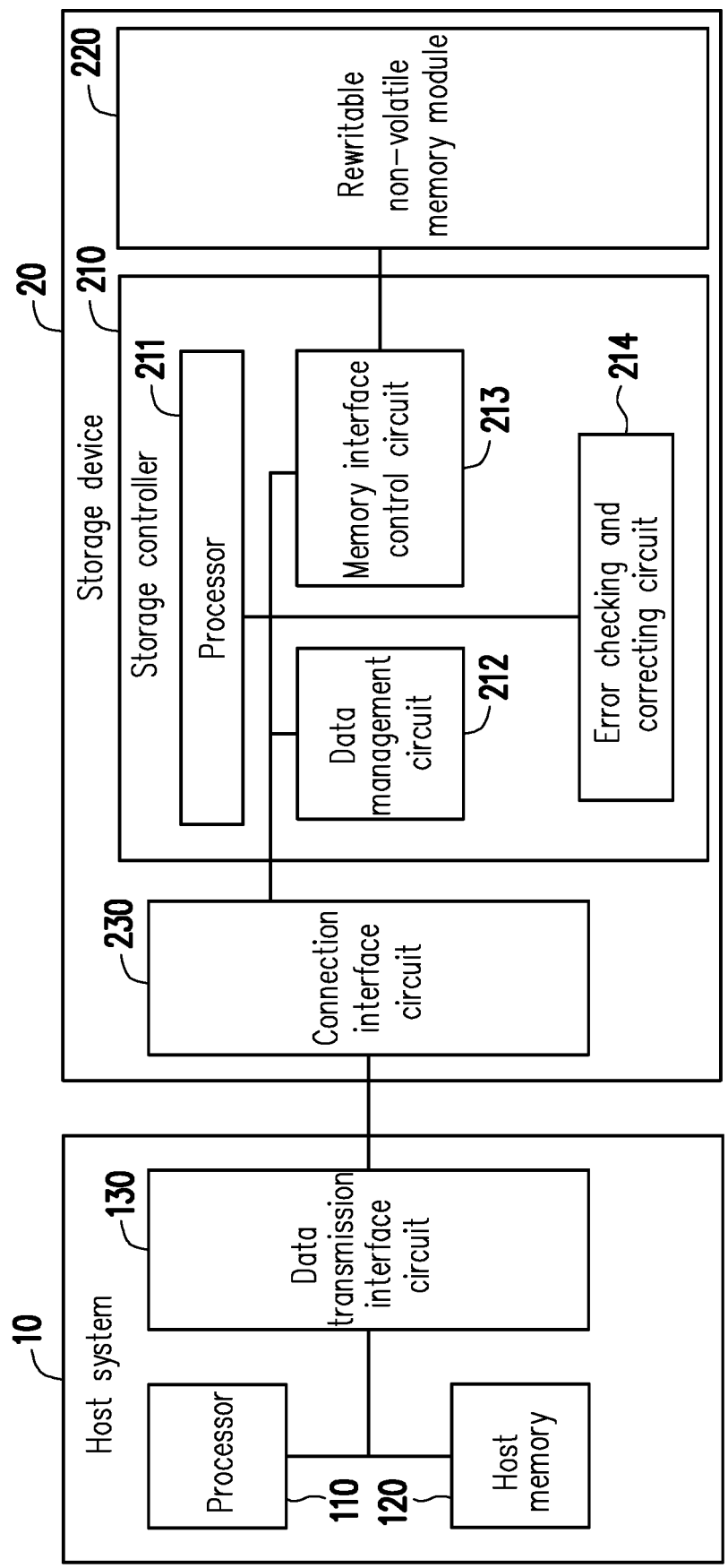
FIG. 1 is a block schematic diagram of a host system and a storage device according to an embodiment of the invention.

FIG. 1 is a block schematic diagram of a host system and a storage device according to an embodiment of the invention.

Referring to FIG. 1, the host system 10 includes a processor 110, a host memory 120 and a data transmission interface circuit 130. In the present embodiment, the data transmission interface circuit 130 is coupled (which is referred to as electrically connected) to the processor 110 and the host memory 120. In another embodiment, the processor 110, the host memory 120 and the data transmission interface circuit 130 are coupled to each other through a system bus.

The storage device 20 includes a storage controller 210, a rewritable non-volatile memory module 220 and a connection interface circuit 230. The storage controller 210 includes a processor 211, a data transfer management circuit 212 and a memory interface control circuit 213.

In the present embodiment, the host system 10 is a coupled to the storage device 20 through the data transmission interface circuit 130 and the connection interface circuit 230 of the storage device 20 to perform a data accessing operation. For example, the host system 10 may store data to the storage device 20 or read data from the storage device 20 through the data transmission interface circuit 130.

In the present embodiment, the processor 110, the host memory 120 and the data transmission interface circuit 130 may be disposed on a motherboard of the host system 10. The number of the data transmission interface circuit 130 may be one or plural. Through the data transmission interface circuit 130, the motherboard may be coupled to the storage device 20 through a wired or wireless manner. The storage device 20 may be a flash driver, a memory card, a solid state drive (SSD) or a wireless memory storage device. The wireless memory storage device may be a memory storage device based on a wireless communication technique such as a near field communication (NFC) memory storage device, a WiFi memory storage device, a Bluetooth memory storage device or a low power consumption Bluetooth memory storage device (for example, iBeacon), etc. Moreover, the motherboard may also be coupled to various I/O devices such as a global positioning system (GPS) module, a network interface card, a wireless transmission device, a keyboard, a screen, a loudspeaker, etc. through the system bus.

In the present embodiment, the data transmission interface circuit 130 and the connection interface circuit 230 are interface circuits compatible to a peripheral component interconnect express (PCI express) standard. Moreover, the data transmission interface circuit 130 and the connection interface circuit 230 perform data transmission there between by using a fast non-volatile memory express (NVMe) communication protocol.

However, it should be noted that the invention is not limited thereto, and the data transmission interface circuit 130 and the connection interface circuit 230 may also be complied with a parallel advanced technology attachment (PATA) standard, an institute of electrical and electronic engineers (IEEE) 1394 standard, a serial advanced technology attachment (SATA) standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multi-media card (MMC) interface standard, an eMMC interface standard, a universal flash storage (UFS) interface standard, an eMCP interface standard, a CF interface standard, an integrated device electronics (IDE) standard or other suitable standards. Moreover, in another embodiment, the connection interface circuit 230 and the storage controller 210 may be packaged in one chip, or the connection interface circuit 230 is disposed outside a chip containing the storage controller 210.

In the present embodiment, the host memory 120 is used for temporarily storing an instruction or data executed by the processor 110. For example, in the present exemplary embodiment, the host memory 120 may be a dynamic random access memory (DRAM), a static random access memory (SRAM), etc. However, it should be noted that the invention is not limited thereto, and the host memory 120 may also be other proper memory.

The storage controller 210 may execute a plurality of logic gates or control instructions implemented in a hardware form or a firmware form, and may perform a data writing operation, reading or erasing operation on the rewritable non-volatile memory module 220 according to commands of the host system 10.

In detail, the processor 211 in the storage controller 210 is hardware having computation capability, which is used for controlling a whole operation of the storage controller 210. To be specific, the processor 211 has a plurality of control instructions, and when the storage device 20 operates, the control instructions are executed to perform the data writing, reading and erasing operations, etc.

It should be noted that in the present embodiment, the processor 110 and the processor 211 are, for example, central processing units (CPU), micro-processors or other programmable microprocessors, digital signal processors (DSP), programmable controllers, application specific integrated circuits (ASIC), programmable logic devices (PLD) or other similar circuit devices, which are not limited by the invention.

In an embodiment, the storage controller 210 further has a read-only memory (not shown) and a random access memory (RAM, not shown). Particularly, the read-only memory has a boot code, and when the storage controller 210 is enabled, the processor 211 first runs the boot code to load the control instructions stored in the rewritable non-volatile memory module 220 to the RAM of the storage controller 210. Then, the processor 211 executes these control instructions to implement the data writing, reading, erasing operations, etc. In another embodiment, the control instructions of the processor 211 may also be stored in a specific area of the rewritable non-volatile memory module 220 in form of program codes, for example, a physical storage unit used for storing system data in the rewritable non-volatile memory module 220.

In the present embodiment, as described above, the storage controller 210 further includes the data transfer management circuit 212 and the memory interface control circuit 213. It should be noted that an operation executed by each part of the storage controller 210 may be regarded as an operation executed by the storage controller 220.

The data transfer management circuit 212 is coupled to the processor 211, the memory interface control circuit 213 and the connection interface circuit 230. The data transfer management circuit 212 receives instructions of the processor 211 to perform data transmission. For example, the data transfer management circuit 212 reads data from the host system 10 (for example, the host memory 120) through the connection interface circuit 230, and writes the reading data into the rewritable non-volatile memory module 220 through the memory interface control circuit 213 (for example, to perform the writing operation according to a writing command coming from the host system 10). For another example, the data transfer management circuit 212 reads data from one or more physical units of the rewritable non-volatile memory module 220 (the data may be read from one or more memory cells in one or more physical units) through the memory interface control circuit 213, and writes the reading data into the host system 10 (for example, the host memory 120) through the connection interface circuit 230 (for example, to perform the reading operation according to a reading command coming from the host system 10). In another embodiment, the data transfer management circuit 212 may also be integrated to the processor 211.

The memory interface control circuit 213 is used for receiving instructions of the processor 211, and performing the writing (which is also referred as programming) operation, the reading operation or the erasing operation to the rewritable non-volatile memory module 220 in collaboration with the data transfer management circuit 212.

For example, the processor 211 may execute a writing command sequence (or the processor 211 instructs the data transfer management circuit 212 to send the writing command sequence to the memory interface control circuit 213) to instruct the memory interface control circuit 213 to write data into the rewritable non-volatile memory module 220; the processor 211 may execute a reading command sequence (or the processor 211 instructs the data transfer management circuit 212 to send the reading command sequence to the memory interface control circuit 213) to instruct the memory interface control circuit 213 to read data from one or more physical units (which are also referred to as target physical units) corresponding to the reading command in the rewritable non-volatile memory module 220; the processor 211 may execute an erasing command sequence (or the processor 211 instructs the data transfer management circuit 212 to send the erasing command sequence to the memory interface control circuit 213) to instruct the memory interface control circuit 213 to perform the erasing operation to the rewritable non-volatile memory module 220. The writing command sequence, the reading command sequence and the erasing command sequence may respectively include one or more program codes or command codes and instruct to perform the corresponding writing, reading or erasing operation to the rewritable non-volatile memory module 220. In an embodiment, the processor 211 may also send other types of command sequences to the memory interface control circuit 213, so as to execute the corresponding operation to the rewritable non-volatile memory module 220.

Moreover, data to be written into the rewritable non-volatile memory module 220 is converted into a format that can be accepted by the rewritable non-volatile memory module 220 through the memory interface control circuit 213. To be specific, when the processor 211 accesses the rewritable non-volatile memory module 220, the processor 211 sends the corresponding command sequence to the memory interface control circuit 213 to instruct the memory interface control circuit 213 to execute the corresponding operation. For example, the command sequences may include a writing command sequence instructing to write data, a reading command sequence instructing to read data, an erasing command sequence instructing to erase data, and corresponding command sequences instructing various memory operations (for example, to change a plurality of preset reading voltage values of a preset reading voltage group to perform the reading operation, or execute a garbage collection procedure, etc.). These command sequences may include one or a plurality of signals, or data on the bus. The signals or data may include command codes or program codes. For example, the reading command sequence may include information of an identification code, a memory address, etc. for reading.

In the present embodiment, the error checking and correcting circuit 214 is used for executing an error checking and correcting procedure to ensure correctness of data. To be specific, when the processor 211 receives a writing command from the host system 11, the error checking and correcting circuit 214 generates an error correcting code (ECC) and/or an error detecting code (EDC) (a coding operation) for the data corresponding to the writing command, and the data transfer management circuit 212 writes the data corresponding to the writing command and the corresponding ECC and/or the EDC to the rewritable non-volatile memory module 220. Then, when the data transfer management circuit 212 reads data from the rewritable non-volatile memory module 220, the ECC and/or the EDC corresponding to the data are simultaneously read, and the error checking and correcting circuit 214 performs the error checking and correcting procedure (a decoding operation) on the reading data according to the ECC and/or the EDC, so as to obtain correct reading data.

In the present embodiment, the error checking and correcting circuit 214 adopts a low density parity code (LDPC) algorithm. The LDPC algorithm uses a parity check matrix to define a valid codeword. After a parity check procedure is performed to data bits (of the codeword) (for example, to multiply a codeword formed by the data bit by the parity check matrix), it is determined whether the codeword is the valid codeword. If the generated codeword is the valid codeword (a vector obtained by multiplying the codeword formed by the data bit by the parity check matrix is zero), it represents that the decoding is successful. Conversely (the vector obtained by multiplying the codeword formed by the data bit by the parity check matrix is not zero), it represents that the decoding is failed. If the multiplication of the parity check matrix and the codeword is a zero vector, it represents that the codeword is the valid codeword. In the present embodiment, the codeword may be the reading data (including one or more data bits) executing the decoding operation, and after the parity check procedure is executed, regardless whether the decoding is successful or failed, a corresponding syndrome is obtained.

In an embodiment, the aforementioned decoding operation may include iterative decoding. To be specific, after each iterative decoding is executed to a reading data (an original codeword), it is calculated that each bit data of the generated codeword should be decoded as a bit "1" or "0". Then, after the parity check procedure is performed to the calculated data bits (for example, to multiply the codeword formed by the data bit by the parity check matrix), it is determined that whether the generated codeword is the valid codeword. If the generated codeword is the valid codeword, it represents that decoding of the reading data (the original codeword) is successful and the iterative decoding is stopped. However, if the generated codeword is not the valid codeword, a next iteration is performed, and the number of times of iterative decoding executed to the reading data is accumulated. If the number of times of iterative decoding executed to the reading data reaches a predetermined value, it represents that the decoding operation corresponding to the reading data is failed and the iterative decoding is stopped.

Figure 2:
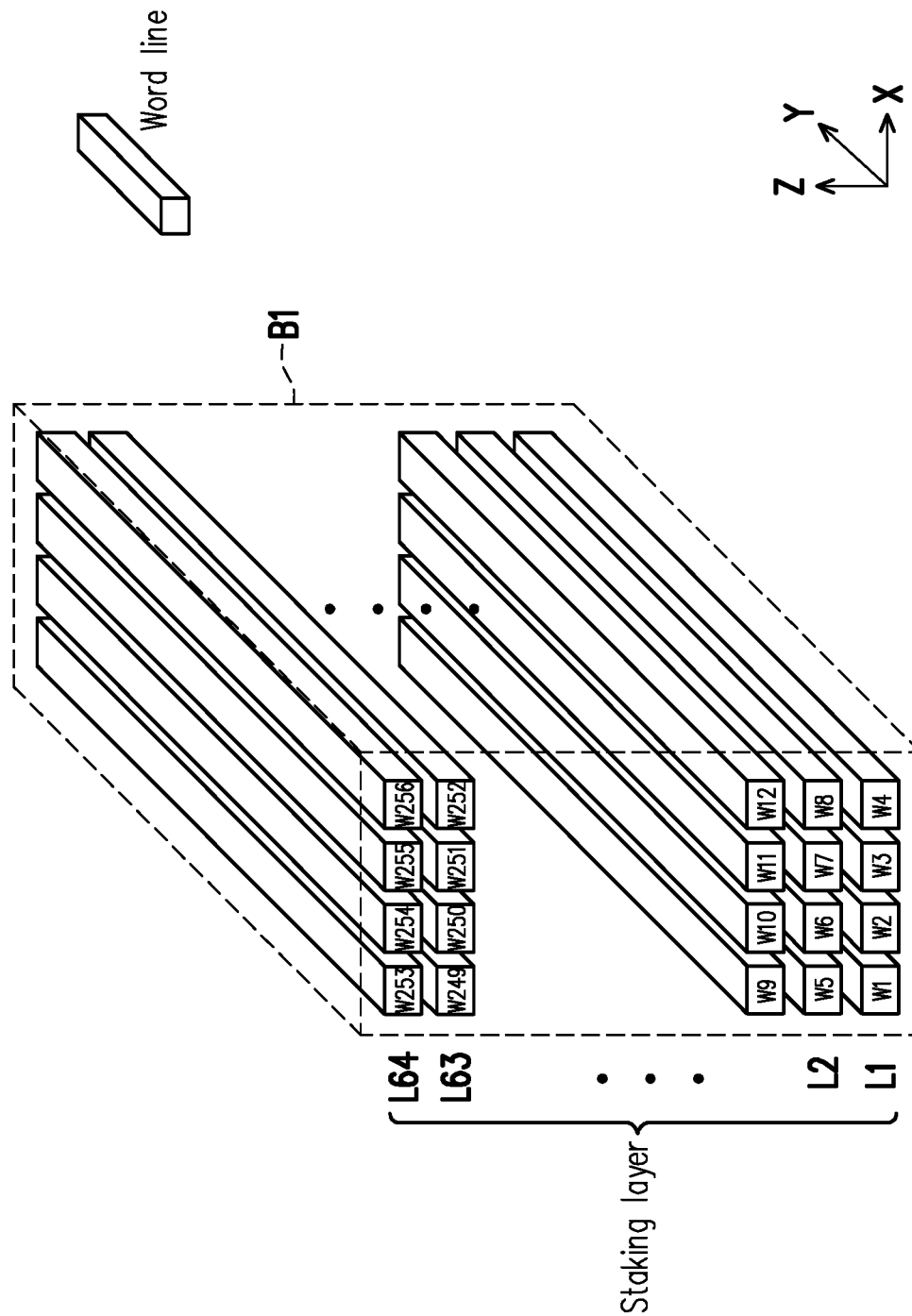
FIG. 2 is a schematic diagram of a plurality of word lines of a 3D physical block according to an embodiment of the invention.

In the present embodiment, the error checking and correcting circuit 214 may implement an effective error correction by slightly adjusting a reading voltage level used for reading memory cells or executing a couple of times of the iterative decoding operation. For example, it is assumed that a depletion (wearing) degree of a plurality of the memory cells in the rewritable non-volatile memory module 220 is very low at the beginning (for example, a P/E Count (PEC) of the memory cells is very small). If data stored in at least one memory cell of the memory cells is to be read, the processor 211 may instruct the data transfer management circuit 212 to send a reading command sequence to the rewritable non-volatile memory module 220. According to the reading command sequence, the memory interface control circuit 213 uses a (predetermined) reading voltage level to read the memory cells of the rewritable non-volatile memory module 220, and transmits obtained data bits (reading data) to the processor 211. However, along with increase of a using time of the rewritable non-volatile memory module 220 (for example, increase of the P/E Count (PEC)) and/or a change of an operation environment, the memory cells in the rewritable non-volatile memory module 220 may have a phenomenon of performance degradation. After the performance degradation is occurred, if the same reading voltage level is applied to read the memory cells, the read data bits probably contains many errors. In the present embodiment, if the rewritable non-volatile memory module 220 is a rewritable non-volatile memory module having a three-dimensional (3D) stacking structure (for example, a 3D NAND flash memory module or a vertical NAND flash memory module), two or more word lines adjacent to each other in the plurality of word lines therein may have a chance in occurrence of a "word line short" phenomenon (a current to travel along an unintended path between this kind of word lines with no or a very low electrical impedance). Data stored in the word lines having the word line short phenomenon may have an error. Referring to FIG. 2 for description of the rewritable non-volatile memory module having the 3D stacking structure, and referring to FIGS. 3A-3D for detailed description of the word line short phenomenon of the rewritable non-volatile memory module having the 3D stacking structure of FIG. 2.

In an embodiment, the error checking and correcting circuit 214 may execute a first type decoding operation (which is also referred to as a hard bit decoding operation) according to the obtained data bits, so as to try to quickly correct the error in the data bits. The hard bit decoding operation is used for decoding read hard bits.

However, limited by a decoding capability (or an error correcting capability) of the hard bit decoding operation, even if more hard decision reading voltage levels are applied to read the memory cells and correspondingly execute more hard decoding procedures, it may not be possible to correct all of the errors through the hard bits read at a single time. Now, the error checking and correcting circuit 214 may execute a second type decoding operation (which is also referred to as a soft bit decoding operation) according to the reading data, so as to try to use more information for error detection. The soft bit decoding operation is used for decoding the reading soft bits.

If the soft bit decoding operation is still unable to decode the correct reading data, the error checking and correcting circuit 214 may execute a third type decoding operation (which is also referred to as a redundant array of independent disk (RAID) decoding operation) according to the reading data, so as to try to use verified information for error detection. Details of the aforementioned hard bit decoding operation, the soft bit decoding operation and the RAID decoding operation are known techniques of the art, and descriptions thereof are not repeated.

It should be noted that the error checking and correcting circuit 214 may respectively obtain corresponding syndromes through the executed first type decoding operation, the second type decoding operation and the third type decoding operation. Moreover, if the first type decoding operation, the second type decoding operation and the third type decoding operation are determined as successful, the corresponding numbers (amounts) of error bits are respectively obtained, which may be obtained by comparing the data bits between the reading data after successful decoding and the reading data before the decoding.

The rewritable non-volatile memory module 220 is coupled to the storage controller 210 (the memory interface control circuit 213) and is used for storing data written by the host system 10. The rewritable non-volatile memory module 220 may be a single level cell (SLC) NAND flash memory module (i.e. a flash memory module with one memory cell storing data of one bit), a multi level cell (MLC) NAND flash memory module (i.e. a flash memory module with one memory cell storing data of two bits), a triple level cell (TLC) NAND flash memory module (i.e. a flash memory module with one memory cell storing data of three bits), a 3D NAND flash memory module or a vertical NAND flash memory module, or other flash memory modules or other memory modules having the same characteristic.

The storage controller 210 may allocate a plurality of logical units to the rewritable non-volatile memory module 220. The host system 10 accesses user data stored in a plurality of physical units through the allocated logical units. Each of the logical units may be composed of one or a plurality of logical addresses. For example, the logical unit may be a logical block, a logical page or a logical sector. One logical unit may be mapped to one or more physical units, where the physical units may be one or more physical addresses, one or more physical sectors, one or more physical programming units or one or more physical erasing units. In the present embodiment, the logical unit is a logical block, and a logical sub unit is a logical page. Each of the logical units has a plurality of logical sub units. In the present embodiment, memory cell page is the smallest unit for writing (programming) data. Physical unit (physical block) is the smallest unit for erasing data, i.e. each physical block contains the least number of memory cells that are erased all together.

In the present embodiment, the memory cells of the rewritable non-volatile memory module 220 may construct a plurality of word lines, and the word lines may construct a plurality of physical blocks (which are also referred to as physical erasing units or physical units). To be specific, the memory cells on a same word line may be divided into one or a plurality of physical programming units. In this way, the memory cells of the rewritable non-volatile memory module 220 may construct a plurality of physical blocks (physical units).

FIG. 2 is a schematic diagram of a plurality of word lines of a 3D physical block according to an embodiment of the invention. Referring to FIG. 2, for example, it is assumed that a physical block B1 of the rewritable non-volatile memory module 220 has 256 word lines W1-W256 constructed by a plurality of memory cells, and every 4 word lines are grouped into one stacking layer. Namely, the physical block B1 has 64 stacking layers L1-L64. During a process of forming the physical block B1 in a memory manufacturing process, since a plurality of word lines is configured in a limited space of the physical block B1 itself, two word lines located adjacent to each other probably contact each other in a large area to produce the word line short phenomenon (or, a gap between the adjacent word lines is too small to allow a current to travel along an unintended path therebetween). It should be noted, the invention is not limited by the reason causing the "word line short" phenomenon.

Figures 3C, 3D:
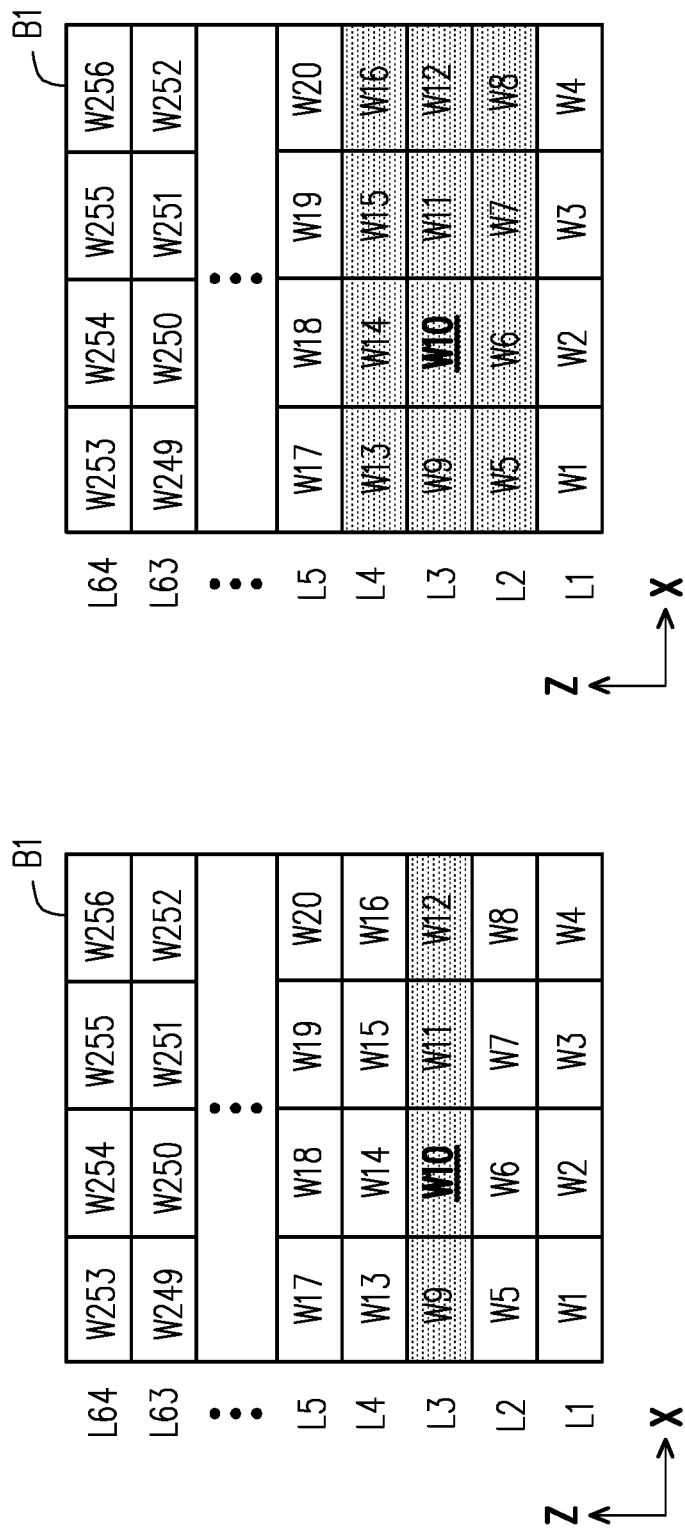

FIG. 3A, 3B, 3C, 3D are schematic diagrams of word line short of different patterns according to an embodiment of the invention. Referring to FIG. 3A, a table of FIG. 3A lists relative positions of the word lines W1-W256 of the physical block B1 of FIG. 2, referential numbers of the corresponding word lines (for example, "W1", "W2", . . . , "W256") and the stacking layers L1-L64. As described above, the adjacent word lines have the word line short phenomenon due to the contact with each other. The pattern of the word line short may refer to a word line short between a target word line (for example, the word line W10) of FIG. 3A and one of the word lines W6, W9, W11, W14 located to the top, bottom, left and right of the word line W10 or a combination thereof (the word lines having the word line short phenomenon are shown in a gray background). Similarly, referring to FIGS. 3B-3C, the pattern of the word line short may refer to the word line short between the target word line (for example, the word line W10) of FIG. 3B and one of the word lines W5, W7, W13, W15 located on diagonal directions of the word line W10 or a combination thereof; the pattern of the word line short may refer to the word line short between the target word line (for example, the word line W10) of FIG. 3C and the word lines W9, W11, W12 belonging to a same stacking layer (for example, the stacking layer L3) with the word line W10, or the word line short between the target word line (for example, the word line W10) of and the word lines W11, W12 belonging to the same stacking layer (for example, the stacking layer L3) with the word line W10; the pattern of the word line short may refer to the word line short between the target word line (for example, the word line W10) of FIG. 3D and the word lines W9, W11, W12 belonging to the same stacking layer (for example, the stacking layer L3) with the word line W10 and a part of or all of the word lines W5-W8, W13-W16 of the upper and lower stacking layers L2, L4. Namely, in totally 12 word lines of W5-W16, the adjacent word lines may regionally have the word line short phenomenon. For example, the word lines W10, W9, W13, W14 have the word line short phenomenon. For another example, the word lines W5-W12 have the word line short phenomenon. For still another example, the word lines W6-W7, W10-W11, W14-W15 have the word line short phenomenon. For still another example, the word lines W5-W7, W9-W11, W13-W15 have the word line short phenomenon. For still another example, the word lines W6-W8, W10-W11, W14 have the word line short phenomenon. Even, in a more severe case, the word line short phenomenon is spread to a range of greater than 3 stacking layers. However, the foregoing examples is for describing various patterns of word line short, and the invention is not limited thereto.

When data is programmed to one of the word lines having the word line short phenomenon, since threshold voltages of the memory cells of the word lines having the word line short phenomenon are influenced (a programming voltage is transmitted to a non-programming word line due to the short), the data stored in a plurality of word lines having the word line short phenomenon has a higher error bit number. Moreover, in a more severe case, the error of the data stored in the plurality of word lines having the word line short phenomenon cannot be corrected by the error checking and correcting circuit 214, and data stored therein is permanently lost (which may be regarded as that the word lines having the word line short phenomenon are damaged). In the present embodiment, the word lines having the word line short phenomenon may be marked as bad word lines.

In the present embodiment, system data used for recording information of a physical block may be recorded by using one or more memory cells in the physical block, or by using one or more memory cells of a specific physical unit in one system area used for recording all of the system data. In the present embodiment, the system data may include a bad physical block table, a word line error value table and a bad word line table corresponding to the plurality of word lines of the rewritable non-volatile memory module 220. The system data may be read from the rewritable non-volatile memory module 220 to a buffer memory of the storage controller for maintenance by the processor 211 when the storage device is power on, and the system data may be updated in real-time. Moreover, when the storage device is power off (or at other moment), the above system data may be backed up to the rewritable non-volatile memory module 220.

The word line error value table is used for recording a plurality of historical error values corresponding to each of the word lines. The word line error value table includes a plurality of word lines and a plurality of entry groups respectively corresponding to the word lines, where each of the entry groups includes one or more entries, and each of the one or more entries records an error value of the word line corresponding to the entry group where the one or more entries belong to. In other words, the processor 211 may record the obtained error values in the word line error value table, so as to update the entries in the entry groups corresponding to the word lines.

For example, regarding each of the word lines, the processor 211 may store the recent N obtained/calculated error values corresponding to each of the word lines in the word line error value table (to become N entries of the entry group corresponding to the word line). Namely, if the rewritable non-volatile memory module 220 has X word lines (the word line error value table has corresponding X entry groups (each of the X entry groups corresponds different X word lines), and each of the entry groups has N entries), the word line error value table may record X*N error values (total X*N entries) respectively corresponding to the X word lines.

The bad word line table is used for recording the word lines marked as bad word lines in the X word lines. In the present embodiment, the bad word line table may record index values of the word lines marked as the bad word lines. For example, it is assumed that the bad word line table records an index value "B1.W1", which represents that the word line W1 of the physical block B1 is marked as the bad word line.

In another embodiment, the bad word line table may sort marking values of all of the word lines according to identification codes of the physical blocks where all of the word lines belong to, and the marking value is used for representing whether the corresponding word line is the bad word line. For example, it is assumed that an identification code of the physical block B1 is the minimum identification code, the physical block B1 is sorted at the forefront (foremost) of all of the physical blocks of the rewritable non-volatile memory module 220, and the word line W1 is sorted at the forefront of all of the word lines of the physical block B1 (since a referential number of the word line W1 is the smallest). In this case, the first marking value of the bad word line table is a marking value corresponding to the word line W1 of the physical block B1. The marking value may be a bit value (for example, "0" or "1"), and different bit values are used for representing whether the bit line is damaged. For example, if the marking value corresponding to the word line W1 of the physical block B1 is "1", it represents that the word line W1 of the physical block B1 is the bad word line.

In an embodiment, the storage controller 210 further includes a buffer memory and power management circuit. The buffer memory is coupled to the processor 211, and is used for temporarily storing data and commands coming from the host system 10, data coming from the rewritable non-volatile memory module 220 or system data used for managing the storage device 20, and the processor 211 may quickly access data, commands or system data from the buffer memory.

The power management circuit is coupled to the processor 211, and is used for controlling a power of the storage device 20.

In the present embodiment, the processor 211 may select one of the word lines (which is also referred to as a first word line) in the plurality of word lines of the rewritable non-volatile memory module 220 at a specific time point to test/mark the bad word line. The specific time point is, for example, one of the following time points or a combination thereof: (1) when data is read from the first word line; (2) when the storage device 20 is idle; (3) when data is written to the first word line; (4) when a garbage collection operation is performed; and (5) when wear-levelling operation is performed. It should be noted that the elected word line is a word line storing data. Details of a reading voltage optimization operation and a corresponding data reading method are described below with reference of a plurality of figures.

First Embodiment

Figure 4:
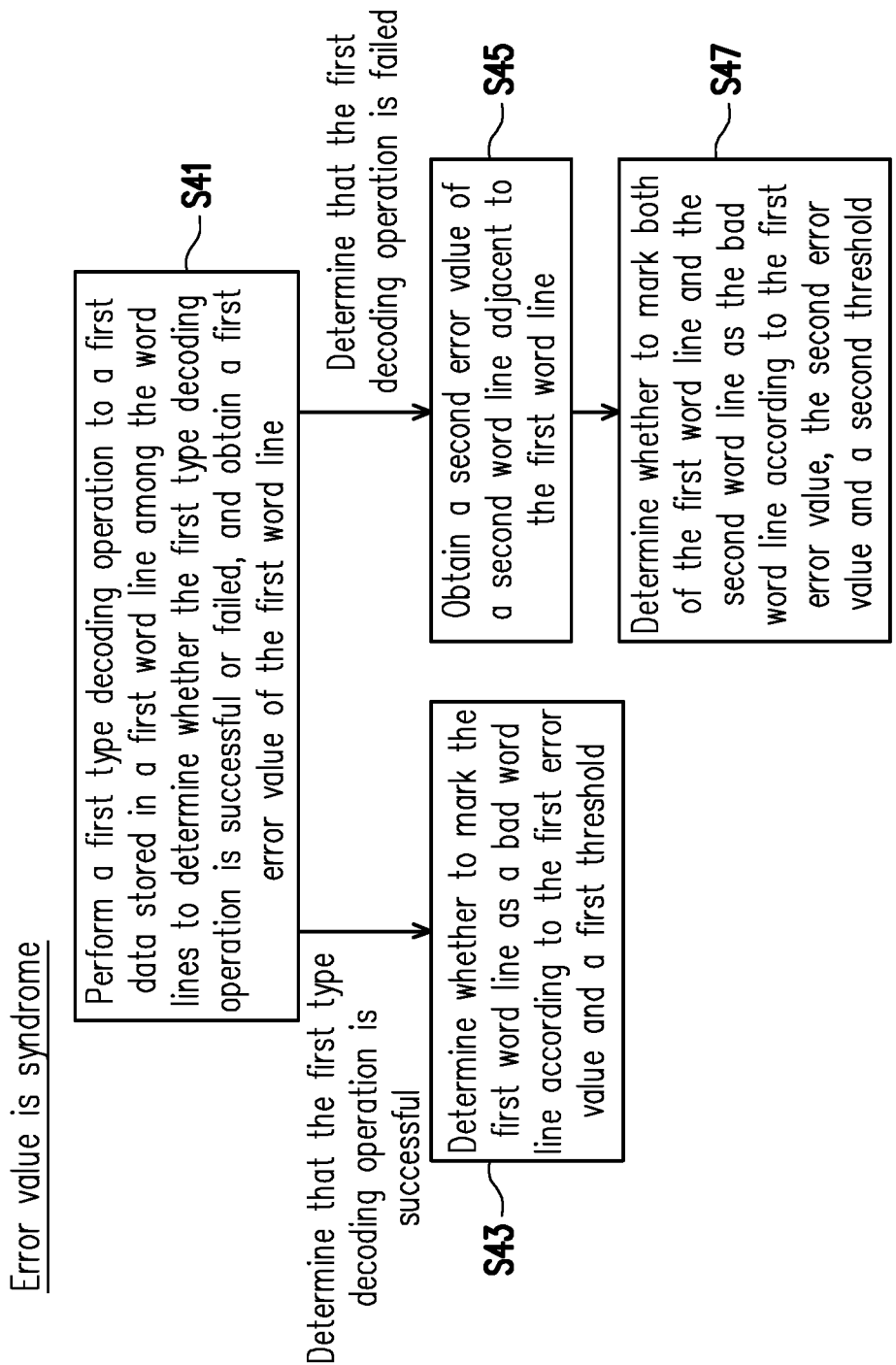
FIG. 4 is a flowchart illustrating a memory management method according to a first embodiment of the invention.

FIG. 4 is a flowchart illustrating a memory management method according to the first embodiment of the invention. Referring to FIG. 1 and FIG. 4, in step S41, the processor 211 performs a first type decoding operation (a hard bit decoding operation) to a first data stored in a first word line among the word lines to determine whether the first type decoding operation is successful or failed, and to obtain a first error value of the first word line.

To be specific, in the present embodiment, the processor 211 actively selects a word line (which is referred to as the first word line hereinafter) from all of the word lines for testing (which is also referred to as checking), so as to determine whether to mark the selected first word line as the bad word line (marked as bad). For example, the processor 211 may test/check each of the word lines when the storage device is idle or when the storage device is power on. For another example, the first word line may be selected from all of the word lines in the rewritable non-volatile memory module 220 according to a specific selection condition. The specific selection condition includes (1) data stored in the selected word line contains an error rate higher than a threshold; or (2) the data stored in the selected word line contains the highest bit error number. In the present embodiment, a testing method is that the processor 211 first reads the data (first data) stored in the first word line, and instructs the error checking and correcting circuit 214 to execute the first type decoding operation to the reading data. The processor 211 may determine whether the first type decoding operation is successful or failed according to a result of the first type decoding operation. Moreover, after the error checking and correcting circuit 214 executes the first type decoding operation to the first data, the error checking and correcting circuit 214 may transmit the generated syndrome to the processor 211. The processor 211 takes the syndrome as a (latest) first error value of the first word line.

When the first type decoding operation is determined as failed, in step S45, the processor 211 obtains a second error value of a second word line adjacent to the first word line. To be specific, when the first type decoding operation performed to the first data by the error checking and correcting circuit 214 is failed, the processor 211 starts to seek an error value (which is also referred to as the second error value) of a word line (which is also referred to as the second word line) adjacent to the first word line, so as to obtain the second error value. As shown in FIGS. 3A-3D, the second bit line adjacent to the first bit line may be one of the word lines located closely to the top, bottom, left, right of the first word line, or located on the diagonal directions of the first word line (taking an XY plane as an example). In the present embodiment, the processor 211 may look up the latest recorded error value corresponding to the second word line according to the word line error value table and the second word line, and takes the latest recorded error value corresponding to the second word line) as the second error value. In another embodiment, the processor 211, for example, executes the first type decoding operation to the data stored in the second word line to obtain the second error value by using the method of the step S41.

After the second error value is obtained, in step S47, the processor 211 determines whether to mark both of the first word line and the second word line as the "bad word line" according to the first error value, the second error value, and a second threshold.

Figure 5:
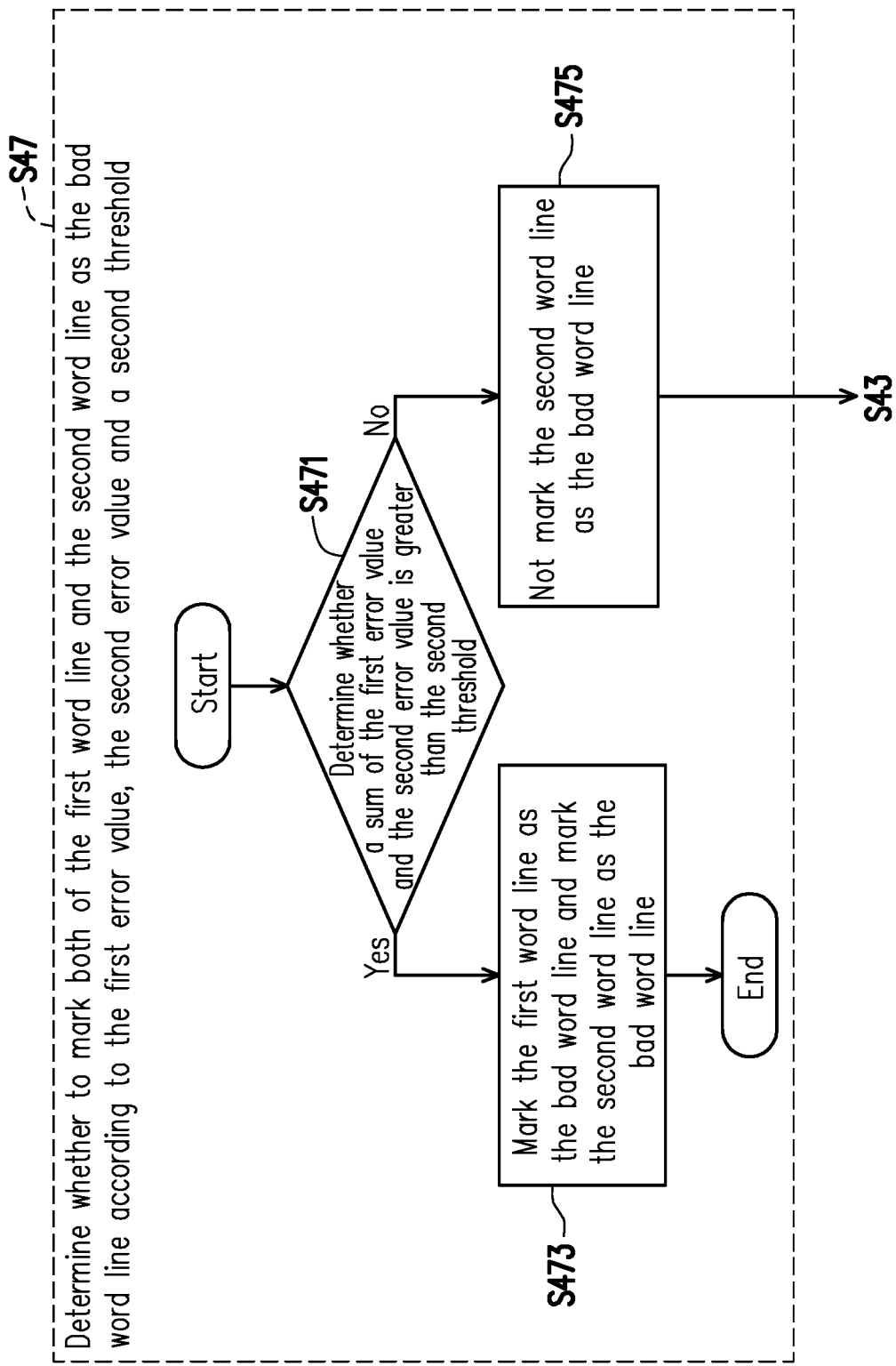
FIG. 5 is a flowchart illustrating detailed steps of a step S47 of FIG. 4 according to the first embodiment of the invention.

FIG. 5 is a flowchart illustrating detailed steps of the step S47 of FIG. 4 according to the first embodiment of the invention. Referring to FIG. 5, in step S471, the processor 211 determines whether a sum of the first error value and the second error value is greater than the second threshold. If it is determined that the sum of the first error value and the second error value is greater than the second threshold, in step S473, the processor 211 marks the first word line as the bad word line, and marks the second word line as the bad word line. Namely, if the sum of the first error value and the second error value is greater than a fixed value (the second threshold), the processor 211 regards that the first word line and the second word line have the word line short phenomenon, and the processor 211 marks the two word lines as the two bad word lines. As described above, the processor 211 may use the bad word line table to mark the first word line and the second word line as the bad word line.

Comparatively, if it is determined that the sum of the first error value and the second error value is not greater than the second threshold, in step S475, the processor 211 does not mark the second word line as the bad word line. Then, the processor 211 executes the step S43 to determine whether the first word line is the bad word line.

It should be noted that if the number of the second word lines (word lines adjacent to the first word line are more than one) is greater than one, the processor 211 may simultaneously or sequentially obtain the second error values of the second word lines. After obtaining the second error values, the processor 211 respectively adds the obtained second error values by the first error value one-by-one for comparing with the second threshold (each of the second error values would be added to the first error value to be compared with the second threshold), so as to determine whether the corresponding second word line is the bad word line.

In the step S41, if the processor 211 determines that the first type decoding operation is successful, in step S43, the processor 211 determines whether to mark the first word line as the bad word line according to the first error value and a first threshold.

Figure 6:
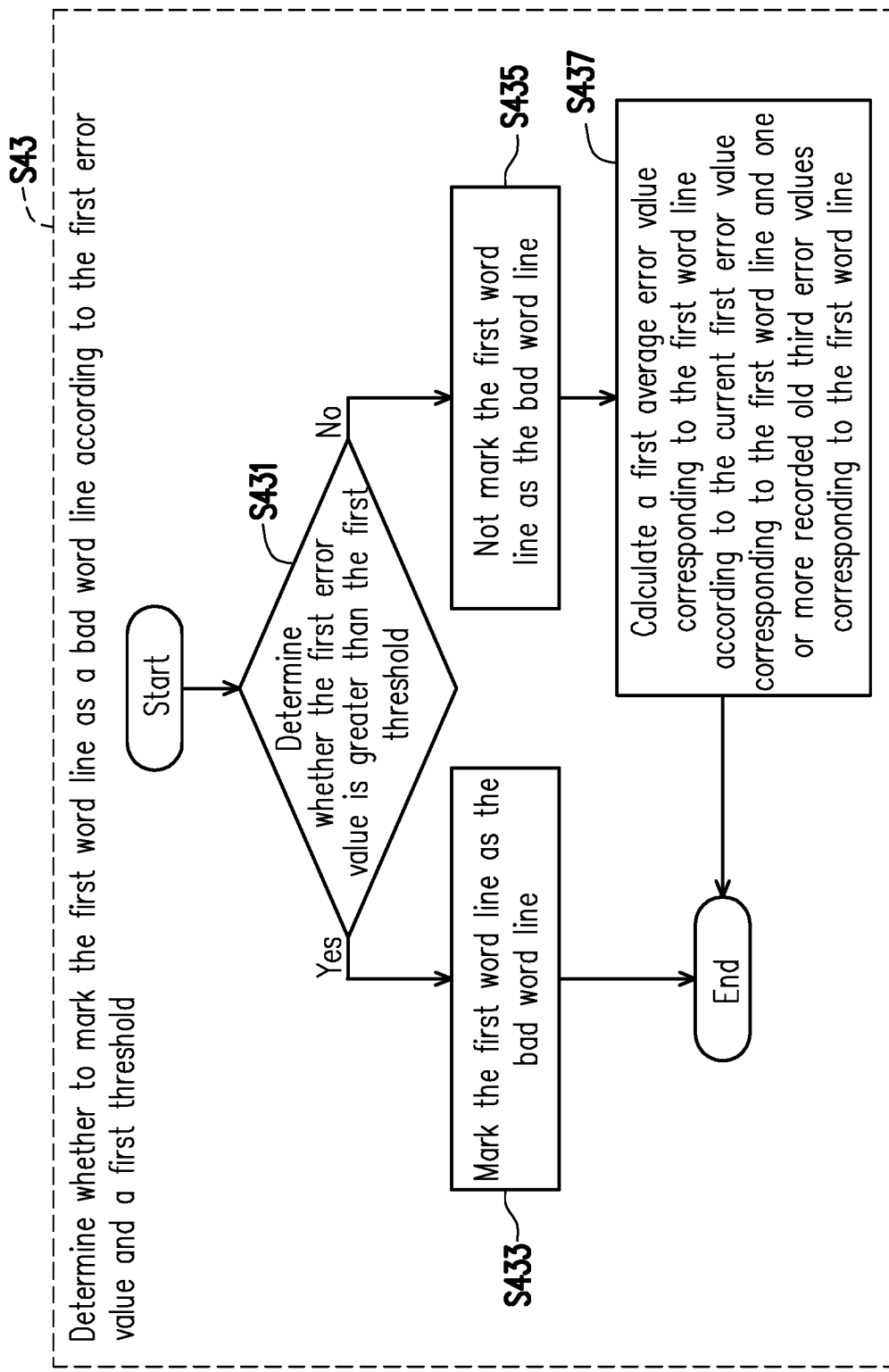
FIG. 6 is a flowchart illustrating detailed steps of a step S43 of FIG. 4 according to the first embodiment of the invention.

FIG. 6 is a flowchart illustrating detailed steps of the step S43 of FIG. 4 according to the first embodiment of the invention. Referring to FIG. 6, in step S431, the processor 211 determines whether the first error value is greater than the first threshold. If it is determined that the first error value is greater than the first threshold, in step S433, the processor 211 marks the first word line as the bad word line. Namely, if the first error value is greater than a fixed value (the first threshold), the processor 211 regards that the first word line is a damaged word line (probably has the word line short phenomenon), and the processor 211 marks the first word line as the bad word line. As describe above, the processor 211 may use the bad word line table to mark the first word line as the bad word line.

If it is determined that the first error value is not greater than the first threshold, in step S435, the processor 211 does not mark the first word line as the bad word line. Then, in step S437, the processor 211 calculates a first average error value corresponding to the first word line according to the current first error value corresponding to the first word line and one or more recorded old third error values corresponding to the first word line. To be specific, the processor 211 looks up one or more error values (which are also referred to as the third error values) of the corresponding word line by using the word line error value table, and calculates an average (which is also referred to as the first average error value) of one or more third error values and the first error value. The processor 211 records the first error value to the word line error value table.

In another embodiment, when the first error value is obtained in the step S41, the processor 211 may directly record the first error value to the word line error value table (to become one of the third error values), in the step S437, an average of a plurality of third error values corresponding to the first word line recorded in the word line error value table is directly calculated, and the average is taken as the first average error value corresponding to the first word line.

However, in an embodiment, as described above, if the error value belongs to the syndrome, the step S437 may not be executed, i.e. the processor 211 may not calculate the first average error value corresponding to the first word line (for example, after the step S435 is completed, the whole flow of the step S43 is directly ended).

It should be noted that the aforementioned first threshold is smaller than the second threshold. A manufacturer may set the first threshold and the second threshold based on a characteristic of the rewritable non-volatile memory module 220.

Second Embodiment

Figure 7:
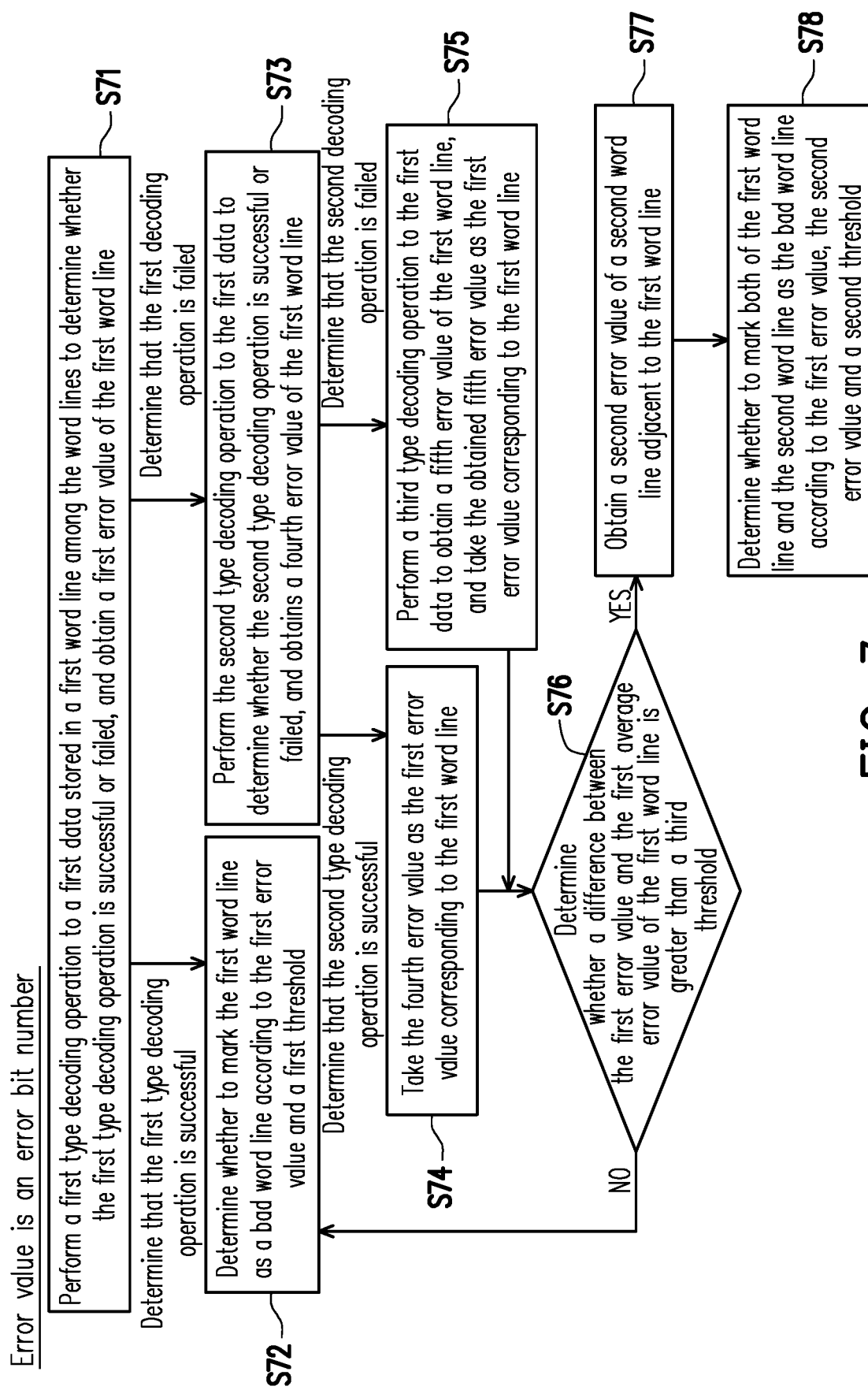
FIG. 7 is a flowchart illustrating a memory management method according to a second embodiment of the invention.

FIG. 7 is a flowchart illustrating a memory management method according to the second embodiment of the invention. The storage controller of the second embodiment and the other hardware devices are the same to that of the first embodiment. All of the error values of the second embodiment belong to the error bit number. In other words, when the error value is not the syndrome of the first embodiment, a difference between the memory management method (the method for determining the bad word line) of the second embodiment and the memory management method of the first embodiment is introduced below. It should be noted that since the error value is the error bit number, after the decoding is determined as successful, the error checking and correcting circuit 214 may obtain the corresponding error bit number, and the processor 211 takes the same (the obtained error bit number) as the corresponding error value.

Referring to FIG. 7, details of steps S71, S72 are respectively the same to the steps S41, S43 of the first embodiment, and details of steps S77, S78 are respectively the same to the steps S45, S47 of the first embodiment, and descriptions thereof are not repeated.

In the present embodiment, in the step S71, if the processor 211 determines that the first type decoding operation is failed, the step S73 is executed, by which the processor 211 performs the second type decoding operation to the first data to determine whether the second type decoding operation is successful or failed, and to obtain a fourth error value of the first word line. In other words, when the hard bit decoding operation is failed, the processor 211 instructs the error checking and correcting circuit 214 to perform the soft bit decoding operation (which is also referred to as the second type decoding operation) to the first data, so as to try to decode the first data. Meanwhile, the error checking and correcting circuit 214 may determine whether the second type decoding operation is successful or failed.

After the second type decoding operation is executed to the first data, if it is determined that the second type decoding operation is successful, a step S74 is executed, by which the processor 211 takes the fourth error value as the first error value corresponding to the first word line. To be specific, if it is determined that the second type decoding operation is successful, the first data is decoded to obtain correct data, and the error checking and correcting circuit 214 may accordingly calculate an error bit number, i.e. the fourth error value. The processor 211 may take the fourth error value as the first error value corresponding to the first word line.

Conversely, after the second type decoding operation is executed to the first data, if it is determined that the second type decoding operation is not successful, a step S75 is executed, by which the processor 211 performs a third type decoding operation to the first data to obtain a fifth error value of the first word line, and takes the obtained fifth error value as the first error value corresponding to the first word line. To be specific, if it is determined that the second type decoding operation is not successful, the processor 211 instructs the error checking and correcting circuit 214 to perform the RAID decoding operation (which is also referred to as the third type decoding operation) to decode the first data, and calculates the error bit number, i.e. the fifth error value according to the decoded first data obtained through the third type decoding operation. The processor 211 takes the fifth error value as the first error value corresponding to the first word line.

After the first error value corresponding to the first word line is obtained, in step S76, it is determined whether a difference between the first error value and the first average error value of the first word line (the difference is calculated by the first error value decreasing minus the first average error value) is greater than a third threshold. To be specific, as described above, the processor 211 may obtain the first average error value corresponding to the first word line. The processor 211 further compares a degree that the first error value obtained after failure of the first type decoding operation is greater than the first average error value, i.e. to compare the difference of the first average error value of the first word line with the third threshold. If the difference between the first error value and the first average error value corresponding to the first word line is not greater than the third threshold, the processor 211 executes the step S72. If the difference between the first error value and the first average error value corresponding to the first word line is greater than the third threshold, the processor 211 executes the step S77.

Namely, in case that the first type decoding operation is failed, the processor 211 executes the second type decoding operation or the third type decoding operation to obtain the first error value, and determines whether the first error value is too high (i.e. the first error value is greater than a sum of the first average error value and the third threshold). If yes, the processor 211 further checks the second word line adjacent to the first word line. It should be noted that the aforementioned third threshold is smaller than the first threshold. The manufacturer may set the value of the third threshold through the characteristic of the rewritable non-volatile memory module 220.

It should be noted that in case that the error value is (set as) the syndrome, the processor 211 may not maintain the word line error value table.

The first embodiment and the second embodiment respectively use the syndrome and the error bit number as the error value to check whether the word line is the bad word line. In other embodiments, the number of times of iterations used in the decoding operation may also be taken as the error value for checking the word line.

Moreover, a third embodiment and a fourth embodiment are provided below to respectively describe how to use the marked bad word lines to implement the other memory management methods after the bad word lines are marked. The third embodiment describes a method of determining a bad physical block by using the number of the bad word lines in the physical block, and the fourth embodiment describes a situation that when a writing operation is executed to write data into the word line, a position of the word line used for storing the data is adjusted according to whether the word line is the bad word line.

Third Embodiment

Figure 8:
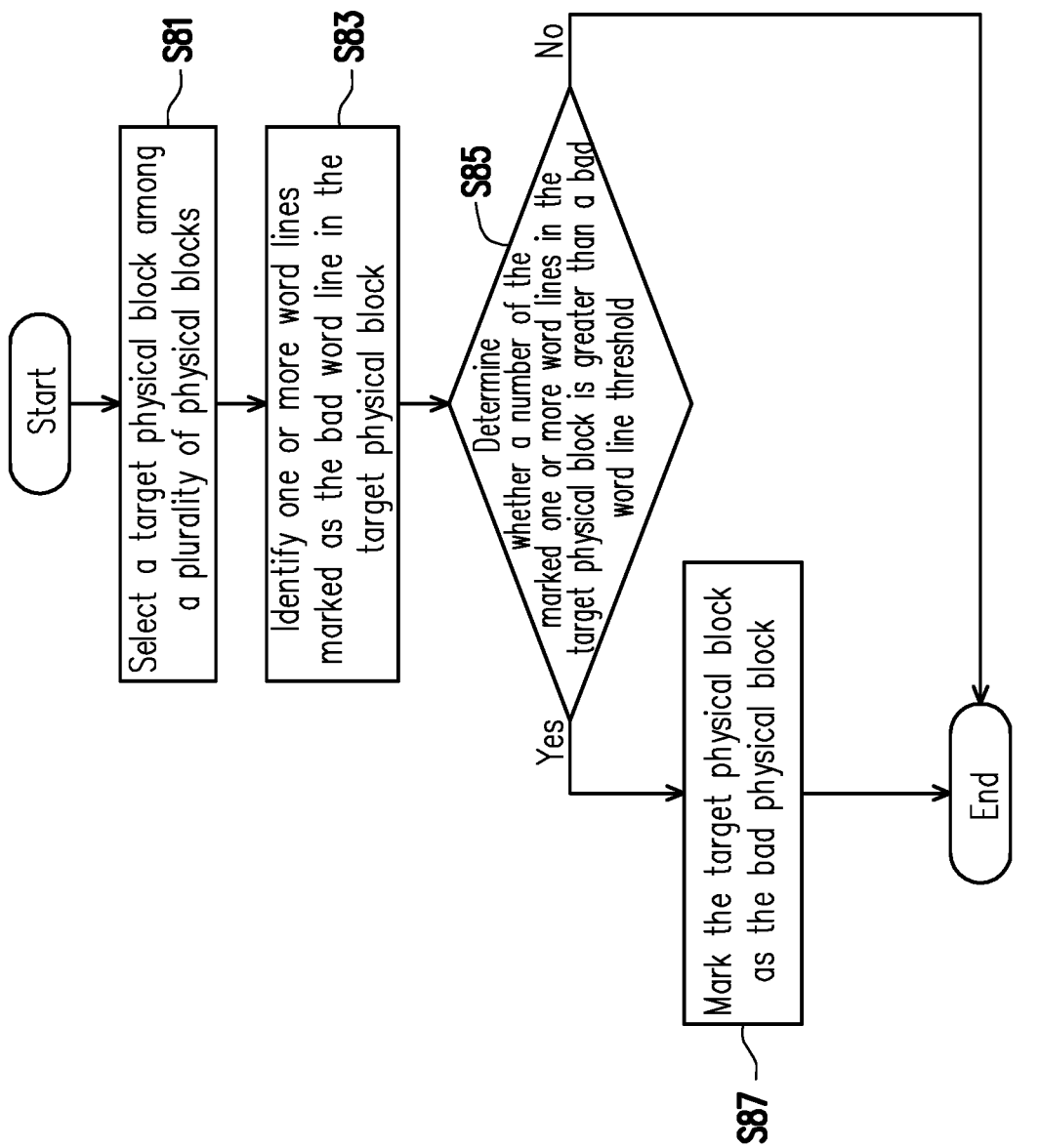
FIG. 8 is a flowchart illustrating a method for marking a bad physical block according to a third embodiment of the invention.

FIG. 8 is a flowchart illustrating a method for marking a bad physical block according to the third embodiment of the invention. Referring to FIG. 8, in step S81, the processor 211 selects a target physical block in a plurality of physical blocks. To be specific, the selected target physical block is the physical block in all of the physical blocks of the rewritable non-volatile memory module 220 that is selected by the processor 211 for determining whether it is the bad physical block. In step S83, the processor identifies one or more word lines marked as the bad word line(s) in the target physical block. To be specific, the processor 211 may look up the word lines that are marked as the bad word lines among all of the word lines of the target physical block according to the bad word line table.

Then, in step S85, the processor 211 determines whether the number of the marked one or more word lines in the target physical block is greater than a bad word line threshold. If it is determined that the number of the marked one or more word lines in the target physical block is greater than the bad word line threshold, in step S87, the processor 211 marks the target physical block as the bad physical block. Namely, if the number of the bad word lines included in the target physical block is larger than a specific value (the bad word line threshold), the processor 211 regards the target physical block as a damaged physical block (bad physical block). The bad word line threshold may be set as, for example, a value of 90% (or other percentage) of the number of all the word lines in one physical block. Conversely, the processor 211 does not regard the target physical block as the damaged physical block, i.e. does not mark the target physical block as the bad physical block. After all of the physical blocks of the rewritable non-volatile memory module 220 are scanned by using the aforementioned method, the processor 211 may identify the bad physical blocks of the rewritable non-volatile memory module 220, and record the result in a bad physical block table.

Fourth Embodiment

Figure 9:
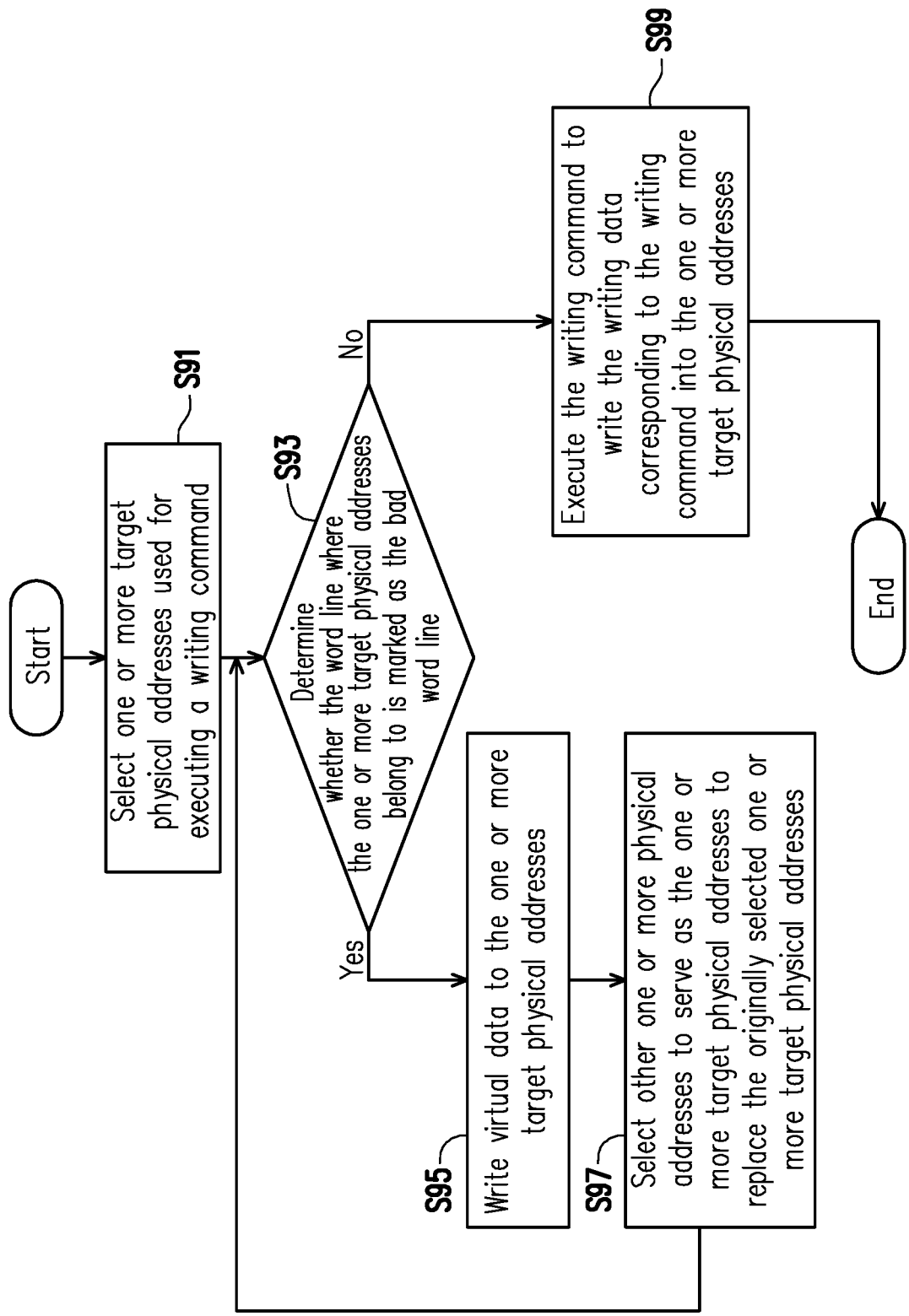
FIG. 9 is a flowchart illustrating a method for executing a writing command according to a fourth embodiment of the invention.

FIG. 9 is a flowchart illustrating a method for executing a writing command according to the fourth embodiment of the invention. Referring to FIG. 9, in step S91, the processor

211 selects one or more target physical addresses used for executing the writing command. To be specific, when the processor 211 executes the writing command to write writing data corresponding to the writing command, the processor 211 may obtain one or more physical addresses (which are also referred to as target physical addresses) used for storing the writing data. In an embodiment, the target physical addresses may be available (blank) physical addresses of an open physical block, which are selected to store the writing data, so as to execute the writing command.

Then, in the step S93, the processor 211 determines whether the word line where the one or more target physical addresses belong to is marked as the bad word line. To be specific, the processor 211 may further check whether the word line where the target physical addresses belong to is the bad word line according to the bad word line table. If it is determined that the word line where the one or more target physical addresses belong to is marked as the bad word line, in step S95, the processor 211 writes virtual data to the one or more target physical addresses. To be specific, if the target physical addresses are in the bad word line, the processor 211 selects the other physical addresses for storing the writing data. However, the processor 211 may first write the virtual data into the originally selected target physical addresses. Then, in step S97, the processor 211 selects other one or more physical addresses to serve as the one or more target physical addresses to replace the originally selected one or more target physical addresses (to store the writing data). Then, the processor 211 programs the writing data to the new selected target physical addresses, so as to complete executing the writing command.

Moreover, in the step S93, if the processor 211 determines that the word line where the one or more target physical addresses belong to is not marked as the bad word line (i.e. the word line where the one or more target physical addresses belong to is not the bad word line), in step S99, the processor 211 directly executes the writing command to write the writing data corresponding to the writing command into the one or more target physical addresses. In this way, before executing a writing command to write writing data into one or more target physical addresses, the processor 211 may write the writing data by determining whether the word line where the one or more target physical addresses belong to is marked as the bad word line.

In summary, in the memory management method and the storage controller provided by the embodiment of the invention, the decoding operation is performed to the data stored in the first word line among the word lines of the rewritable non-volatile memory module, so as to determine whether to mark the first bit line as the bad word line according to the result of the decoding operation and the correspondingly obtained error value. Moreover, a decoding operation is further performed to the data stored in the second word line adjacent to the first word line, so as to determine whether to mark both of the first word line and the second word line as the bad word line according to the result of the decoding operation and the correspondingly obtained error value. In this way, it is effectively determined whether the word lines of the rewritable non-volatile memory module are damaged, so as to improve utilization efficiency of an available space of the rewritable non-volatile memory module. Moreover, by marking the bad word lines, the problem of unable to correct data error caused by the word line short phenomenon is avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory management method, adapted to a rewritable non-volatile memory module, wherein the rewritable non-volatile memory module has a plurality of word lines, and each of the word lines is composed of one or more memory cells, the memory management method comprising:
    performing a first type decoding operation to a first data stored in a first word line among the word lines to determine whether the first type decoding operation is successful or failed, and obtain a first error value of the first word line;
    when the first type decoding operation is determined as successful, determining whether to mark the first word line as a bad word line according to the first error value and a first threshold; and
    when the first decoding operation is determined as failed, obtaining a second error value of a second word line adjacent to the first word line, and determining whether to mark both of the first word line and the second word line as the bad word line according to the first error value, the second error value and a second threshold,
    wherein the first error value and the second error value comprise an error bit number or a syndrome, wherein if values of the first error value and the second error value belong to the error bit number, the memory management method further comprises:
    when the first type decoding operation is determined as failed and before the second error value is obtained, performing a second type decoding operation to the first data to determine whether the second type decoding operation is successful or failed, and obtaining a fourth error value of the first word line;
    when the second type decoding operation is determined as successful, taking the fourth error value as the first error value corresponding to the first word line; and
    when the second type decoding operation is determined as failed, performing a third type decoding operation to the first data to obtain a fifth error value of the first word line, and taking the obtained fifth error value as the first error value corresponding to the first word line, wherein values of the fourth and the fifth error values also belong to the error bit number.

2. The memory management method as claimed in claim 1, wherein the step of determining whether to mark both of the first word line and the second word line as the bad word line according to the first error value, the second error value and the second threshold comprises:
    determining whether a sum of the first error value and the second error value is greater than the second threshold;
    when the sum is determined as greater than the second threshold, marking the first word line as the bad word line and marking the second word line as the bad word line; and
    when the sum is determined as not greater than the second threshold, not marking the second word line as the bad word line, and executing the aforementioned step of determining whether to mark the first word line according to the first error value and the first threshold.

3. The memory management method as claimed in claim 2, wherein the step of determining whether to mark the first word line as the bad word line according to the first error value and the first threshold comprises:

determining whether the first error value is greater than the first threshold;

when the first error value is determined as greater than the first threshold, marking the first word line as the bad word line; and when the first error value is determined as not greater than the first threshold, not marking the first word line as the bad word line, and calculating a first average error value corresponding to the first word line according to the current first error value corresponding to the first word line and one or more recorded old third error values corresponding to the first word line.

4. The memory management method as claimed in claim 1, wherein the step of obtaining the second error value of the second word line adjacent to the first word line comprises:

performing the first type decoding operation to second data store in the second word line to obtain the second error value of the second word line.

5. The memory management method as claimed in claim 1, further comprising:

recording the obtained first error value in a word line error value table to update a first entry in a first entry group corresponding to the first word line, wherein the word line error value table comprises the word lines and a plurality of entry groups respectively corresponding to the word lines, wherein each of the entry groups comprises one or more entries, and each of the one or more entries records an error value of a word line corresponding to the entry group where the one or more entries belong to; and when the first type decoding operation is determined as successful, determining whether the first error value is greater than the first threshold, wherein when the first error value is determined as not greater than the first threshold, a first average error value corresponding to the first word line is calculated according to the word line error value table.

6. The memory management method as claimed in claim 5, further comprising:

when the first type decoding operation is determined as failed and before the second error value is obtained, determining whether a difference between the first error value and the first average error value is greater than a third threshold;

when the difference is determined as greater than the third threshold, reading a latest second entry in a second entry group corresponding to the second word line from the word line error value table to obtain the second error value, and executing the aforementioned step of determining whether to mark both of the first word line and the second word line as the bad word line according to the first error value, the second error value and the second threshold; and when the difference is determined as not greater than the third threshold, executing the aforementioned step of determining whether to mark the first word line as the bad word line according to the first error value and the first threshold.

7. The memory management method as claimed in claim 1, wherein the first type decoding operation is a hard bit decoding operation, the second type decoding operation is a soft bit decoding operation, and the third type decoding operation is a RAID decoding operation.

8. The memory management method as claimed in claim 1, further comprising:

when the fourth error value or the fifth error value is taken as the first error value, determining whether a difference between the first error value and a first average error value corresponding to the first word line is greater than a third threshold;

when the difference is determined as greater than the third threshold, obtaining the second error value corresponding to the second word line, and executing the aforementioned step of determining whether to mark both of the first word line and the second word line as the bad word line according to the first error value, the second error value and the second threshold; and when the difference is determined as not greater than the third threshold, executing the aforementioned step of determining whether to mark the first word line as the bad word line according to the first error value and the first threshold.

9. The memory management method as claimed in claim 1, wherein the word lines are divided into a plurality of physical blocks, and the memory management method further comprises:

selecting a target physical block in the physical blocks; and identifying one or more word lines marked as the bad word line in the target physical block, and determining whether the target physical block is a bad physical block according to the number of the one or more word lines marked as the bad word line and a bad word line threshold.

10. The memory management method as claimed in claim 1, further comprising:

before a writing command is executed to write a writing data into one or more target physical addresses, writing the writing data according to a result of determining whether the word line where the one or more target physical addresses belong to is marked as the bad word line.

11. A storage controller, adapted to control a storage device configured with a rewritable non-volatile memory module, wherein the rewritable non-volatile memory module has a plurality of word lines, and each of the word lines is composed of one or more memory cells, the storage controller comprising:

a connection interface circuit, coupling to a host system;

a memory interface control circuit, coupling to the rewritable non-volatile memory module;

an error checking and correcting circuit, configured to perform a decoding operation; and a processor, wherein the processor is configured to instruct the error checking and correcting circuit to perform a first type decoding operation to a first data stored in a first word line among the word lines to determine whether the first type decoding operation is successful or failed, and obtain a first error value of the first word line, wherein when the first type decoding operation is determined as successful, the processor further determines whether to mark the first word line as a bad word line according to the first error value and a first threshold, when the first decoding operation is determined as failed, the processor obtains a second error value of a second word line adjacent to the first word line, and determines whether to mark both of the first word line and the second word line as the bad word line according to the first error value, the second error value, and a second threshold, wherein the first error value and the second error value comprise an error bit number or a syndrome, wherein if values of the first error value and the second error value belong to the error bit number, when the first type decoding operation is determined as failed and before the second error value is obtained, the processor instructs the error checking and correcting circuit to perform a second type decoding operation to the first data to determine whether the second type decoding operation is successful or failed, and obtains a fourth error value of the first word line, wherein when the second type decoding operation is determined as successful, the processor takes the fourth error value as the first error value corresponding to the first word line, wherein when the second type decoding operation is determined as failed, the processor performs a third type decoding operation to the first data to obtain a fifth error value of the first word line, and takes the obtained fifth error value as the first error value corresponding to the first word line, wherein values of the fourth and the fifth error values also belong to the error bit number.

12. The storage controller as claimed in claim 11, wherein in the operation that the processor determines whether to mark both of the first word line and the second word line as the bad word line according to the first error value, the second error value and the second threshold, the processor determines whether a sum of the first error value and the second error value is greater than the second threshold, wherein when the sum is determined as greater than the second threshold, the processor marks the first word line as the bad word line and marks the second word line as the bad word line, wherein when the sum is determined as not greater than the second threshold, the processor does not mark the second word line as the bad word line, and executes the aforementioned operation of determining whether to mark the first word line according to the first error value and the first threshold.

13. The storage controller as claimed in claim 12, wherein in the operation that the processor determines whether to mark the first word line as the bad word line according to the first error value and the first threshold, the processor determines whether the first error value is greater than the first threshold, wherein when the first error value is determined as greater than the first threshold, the processor marks the first word line as the bad word line, wherein when the first error value is determined as not greater than the first threshold, the processor does not mark the first word line as the bad word line, and calculates a first average error value corresponding to the first word line according to the current first error value corresponding to the first word line and one or more recorded old third error values corresponding to the first word line.

14. The storage controller as claimed in claim 11, wherein in the operation that the processor obtains the second error value of the second word line adjacent to the first word line, the processor instructs the error checking and correcting circuit to perform the first type decoding operation to second data store in the second word line to obtain the second error value of the second word line.

15. The storage controller as claimed in claim 11, wherein the processor further records the obtained first error value in a word line error value table to update a first entry in a first entry group corresponding to the first word line, wherein the word line error value table comprises the word lines and a plurality of entry groups respectively corresponding to the word lines, wherein each of the entry groups comprises one or more entries, and each of the one or more entries records an error value of a word line corresponding to the entry group where the one or more entries belong to, wherein when the first type decoding operation is determined as successful, the processor determines whether the first error value is greater than the first threshold, wherein when the first error value is determined as not greater than the first threshold, the processor further calculates a first average error value corresponding to the first word line according to the word line error value table.

16. The storage controller as claimed in claim 15, wherein when the first type decoding operation is determined as failed and before the second error value is obtained, processor further determines whether a difference between the first error value and the first average error value is greater than a third threshold, wherein when the difference is determined as greater than the third threshold, the processor reads a latest second entry in a second entry group corresponding to the second word line from the word line error value table to obtain the second error value, and executes the aforementioned operation of determining whether to mark both of the first word line and the second word line as the bad word line according to the first error value, the second error value and the second threshold, wherein when the difference is determined as not greater than the third threshold, the processor executes the aforementioned operation of determining whether to mark the first word line as the bad word line according to the first error value and the first threshold.

17. The storage controller as claimed in claim 11, wherein the first type decoding operation is a hard bit decoding operation, the second type decoding operation is a soft bit decoding operation, and the third type decoding operation is a RAID decoding operation.

18. The storage controller as claimed in claim 11, wherein when the fourth error value or the fifth error value is taken as the first error value, the processor determines whether a difference between the first error value and a first average error value corresponding to the first word line is greater than a third threshold, wherein when the difference is determined as greater than the third threshold, the processor obtains the second error value corresponding to the second word line, and executes the aforementioned operation of determining whether to mark both of the first word line and the second word line as the bad word line according to the first error value, the second error value and the second threshold, wherein when the difference is determined as not greater than the third threshold, the processor executes the aforementioned operation of determining whether to mark the first word line as the bad word line according to the first error value and the first threshold.

19. The storage controller as claimed in claim 11, wherein the word lines are divided into a plurality of physical blocks, wherein the processor selects a target physical block in the physical blocks; and wherein the processor identifies one or more word lines marked as the bad word line in the target physical block, and determines whether the target physical block is a bad physical block according to the number of the one or more word lines marked as the bad word line and a bad word line threshold.

20. The storage controller as claimed in claim 11, wherein before a writing command is executed to write a writing data into one or more target physical addresses, the processor writes the writing data according to a result of determining whether the word line where the one or more target physical addresses belong to is marked as the bad word line.

\* \* \* \* \*